(12) United States Patent
Chuang et al.

(10) Patent No.: US 7,050,282 B2
(45) Date of Patent: May 23, 2006

(54) POWER SUPPLY CLAMP CIRCUIT

(75) Inventors: Chien-Hui Chuang, Taipei Hsien (TW); Hung-Yi Chang, Hsin-Chu (TW); Yi-Hua Chang, Hsin-Chu Hsien (TW)

(73) Assignee: Faraday Technology Corp., Hsin-Chu (TW)

( * ) Notice: Subject to any disclaimer, the term of this patent is extended or adjusted under 35 U.S.C. 154(b) by 300 days.

(21) Appl. No.: 10/604,362

(22) Filed: Jul. 15, 2003

(65) Prior Publication Data

US 2005/0013072 A1    Jan. 20, 2005

(51) Int. Cl.
*H02H 3/00*    (2006.01)
*H02H 7/00*    (2006.01)

(52) U.S. Cl. .................. 361/100; 361/56; 361/91.1; 361/111; 361/91.5; 361/18

(58) Field of Classification Search ............ 361/111, 361/56, 91.1, 91.3, 100; 327/110
See application file for complete search history.

(56) References Cited

U.S. PATENT DOCUMENTS

| | | | | |
|---|---|---|---|---|
| 5,550,497 A | * | 8/1996 | Carobolante | ............... 327/110 |
| 6,249,410 B1 | * | 6/2001 | Ker et al. | ..................... 361/56 |
| 6,344,417 B1 | * | 2/2002 | Usenko | ..................... 438/733 |

* cited by examiner

*Primary Examiner*—Phuong T. Vu
*Assistant Examiner*—Dharti H. Patel
(74) *Attorney, Agent, or Firm*—Winston Hsu

(57) ABSTRACT

A power supply clamp circuit for preventing damage to an integrated circuit due to electrostatic discharge. The power supply clamp circuit includes a voltage generator electrically connected to a first node for generating a voltage; a first PMOS transistor having a source electrically connected to the first voltage source, a gate electrically connected to the first node, and a drain electrically connected to a second node; a first NMOS transistor having a drain electrically connected to the second node, a gate electrically connected to the first node, and a source connected to ground; a second NMOS transistor having a drain electrically connected to the first voltage source, a gate electrically connected to the second node, and a source connected to ground; and a second PMOS transistor having a source electrically connected to the second node, a gate and a drain commonly electrically connected to the first node.

11 Claims, 4 Drawing Sheets

POWER SUPPLY CLAMP CIRCUIT

BACKGROUND OF INVENTION

1. Field of the Invention

The present invention provides a power supply clamp circuit, and more particularity a power supply clamp circuit capable of providing an ideal bias control mechanism.

2. Description of the Prior Art

Integrated circuits, with advantages of smaller volume and higher density, are very applicable in complicated and concentrated modern microprocessor and memory circuits. Moreover, integrated circuits produced by semiconductor processes have already become mainstream in the design and manufacture of current large-scale circuits. In contrast with conventional scattered circuits, integrated circuits have a very serious problem of an exterior electrostatic discharge that easily damages fragile interior circuits. Because the size of each component and the distance between each component in integrated circuits shrink substantially, a larger pulse generated by an electrostatic discharge increases the possibility of damage to the components. Therefore, an electrostatic discharge damaging the components of integrated circuits becomes a more serious problem as smaller sizes of components are produced by advantaged process technologies.

Usually an electrostatic discharge occurs when an electrostatic carrier (such as a finger carrying charges) storing a huge amount of charges touches the integrated circuits. Therefore, usually there are two paths for charges of a carrier getting into the integrated circuits. One is from a signal end to get into the integrated circuits as a Pin-to-Pin Route, and the other is from a power supply end to get into the integrated circuits as Power-to-Ground Route. In the prior art, an electrostatic discharge level is generally defined as the level of electrostatic discharge that the integrated circuits are capable of tolerating while avoiding damage to the components. In order to enhance the electrostatic discharge level, the prior art usually sets up a clamp circuit between ends of a possible route for electrostatic discharge.

Please refer to FIG. 1. FIG. 1 is a perspective view of a prior art power supply clamp circuit 10 electrically connected to a first power supply source P1 and to ground. The power supply clamp circuit 10 comprises a first PMOS transistor 12, a first NMOS transistor 14, a second NMOS transistor 16, a resistor 18, and a capacitor 20. The first PMOS transistor 12 has a source electrically connected to a first voltage source P1, a gate electrically connected to a first node N1, and a drain electrically connected to a second node N2. The first NMOS transistor 14 has a drain electrically connected to the second node N2, a gate electrically connected to the first node N1, and a source connected to ground. The second NMOS transistor 16 has a drain electrically connected to the first voltage source P1, a gate electrically connected to the second node N2, and a source connected to ground. One end of the resistor 18 is electrically connected to the first voltage source P1 and another end of the resistor 18 is electrically connected to the first node N1. One end of the capacitor 20 is electrically connected to the first node N1 and another end of the capacitor 20 is connected to ground.

In FIG. 1, a combination of the resistor 18 and the capacitor 20 can be functionally regarded as a voltage generator to generate a voltage at the first node N1. The voltage at the first node N1 is a sensitive value to an electrostatic discharge and responds differently under a condition of normal operation and a condition of an electrostatic discharge in the integrated circuits. The electrostatic discharge phenomenon is a huge amount of charges performing a discharge to the first voltage source P1 that results in a voltage pulse increasing in velocity very quickly at the first voltage source P1.

Specifically, when the first voltage source P1 turns on during normal operation, a voltage at the first voltage source P1 increases in velocity very slowly such as from 0V to a predetermined operating voltage in few microseconds or even few milliseconds. However, when an electrostatic discharge occurs, a voltage pulse is generated and results in the first voltage source P1 increasing from in only few nanoseconds. Therefore, the voltage generator combined by the above-mentioned resistor 18 and capacitor 20 generates a voltage corresponding to different increasing velocities of the voltage at the first voltage source P1.

Those skilled in the art will recognize that the resistor 18 and the capacitor 20 function as a low-pass filter. When the first voltage source P1 turns on during normal operation, the voltage at the first voltage source P1 increases in velocity very slowly. Then, the voltage at the first node N1 and the voltage at the first voltage source P1 increases simultaneously. When an electrostatic discharge occurs, the voltage at the first voltage source P1 increases in velocity very quickly. At this time, because of how the low-pass filter works, during a transient time of the voltage at the first voltage source P1 starting to increase, the voltage at the first node N1 cannot completely respond with the voltage increasing velocity at the first voltage source P1. This results in an obvious voltage difference between the first voltage source P1 and the first node N1.

Because of the voltage generator formed by combining by the resistor 18 and the capacitor 20 has the above-mentioned characteristics, the first voltage source P1 turns on during normal operation. Then, a voltage difference between the first node N1 and the first voltage source P1 will not appear during a voltage increasing process at the first voltage source P1. That is, a voltage difference $V_{spp1}$ between a source (as the voltage source P1) and a gate (as the first node N1) of the first PMOS transistor 12 is equal to 0 V. Then, the PMOS transistor 12 turns off during the voltage increasing process at the first voltage source P1. After a voltage at the first node N1 increases to a voltage that can turn on the first NMOS transistor 14, a voltage at the second node N2 descends to ground when the first NMOS transistor 14 turns on. Therefore, the second NMOS transistor 16 always keeps the status of turning off to avoid the leakage current from the first voltage source P1 to ground.

A voltage pulse is generated at the first voltage source P1 in very quick velocity when an electrostatic discharge occurs. Then, as mentioned above a voltage difference is generated between the first node N1 and the first voltage source P1 by means of the function of low-pass filter. That is, a voltage difference $V_{sgp12}$ between a source (as the first voltage source P1) and a gate (as the first node N1) of the first PMOS transistor 12 is greater than a threshold voltage of the PMOS transistor 12 to result in the first PMOS transistor 12 getting into the status of turning on. When the first PMOS transistor 12 turns on, a voltage at the second node N2 will be pulled up by the first voltage source P1 to make the second NMOS transistor 16 turn on. Through the above-mentioned actions, the power supply clamp circuit 10 provides a current path from the first voltage source P1 to ground by means of turning on the second NMOS transistor 16. When the voltage of the first voltage source P1 achieves the device''s breakdown voltage, the ESD current is bypassed through the parasitic. Therefore, a voltage pulse at the first voltage source P1 generated by an electrostatic discharge performs a discharge through the path to ground and does not to damage the interior circuits of integrated circuits. Please note that the second NMOS transistor 16 usually is designed as a bigger size of transistor to enhance an electrostatic discharge level of the power supply clamp circuit 10.

However, the electrostatic discharge level of the power supply clamp circuit 10 highly relates with a gate bias of the second NMOS transistor 16 as a gate bias effect. When the PMOS transistor 12 turns on to make the second NMOS transistor 16 turn on, a bias at the gate (as the second node N2) of the second NMOS transistor 16 must be controlled in a suitable voltage range capable of maintaining the best status of an electrostatic discharge level of the power supply clamp circuit 10. When a bias at the gate of the second NMOS transistor 16 is higher, the electrostatic discharge level of the power supply clamp circuit 10 will decline substantially.

Therefore, in order to control the gate bias of the second NMOS transistor 16 within a suitable voltage range, a circuit designer must perform a very precise control of parameters such as the length and width of the gate of the first PMOS transistor 12 and the first NMOS transistor 14 during a designing process of the power supply clamp circuit 10. This increases time and human costs of a circuit design.

SUMMARY OF INVENTION

It is therefore a primary objective of the claimed invention to provide a power supply clamp circuit capable of providing an ideal bias control mechanism to solve the above-mentioned problems.

According to the claimed invention, a power supply clamp circuit is to prevent damage to integrated circuits when an electrostatic discharge occurs at a first voltage source of the integrated circuits. The power supply clamp circuit includes a first voltage generator electrically connected to a first node for generating a voltage, a first PMOS transistor, a first NMOS transistor, a second NMOS transistor, and a second PMOS transistor. The first PMOS transistor has a source electrically connected to a first voltage source, a gate electrically connected to a first node, and a drain electrically connected to a second node. The first NMOS transistor has a drain electrically connected to the second node, a gate electrically connected to the first node, and a source connected to ground. The second NMOS transistor has a drain electrically connected to the first voltage source, a gate electrically connected to the second node, and a source connected to ground. The second PMOS transistor has a source electrically connected to the second node, a gate and a drain both electrically connected to the first node.

The power supply clamp circuit of the claimed invention utilizes a design of a second PMOS transistor between the first node and the second node to confine a voltage at the second node in a desired voltage range. Therefore, circuit designers can simplify adjusting processes of circuit parameters to maintain a higher electrostatic discharge level of the power supply clamp circuit and reduce design costs.

DETAILED DESCRIPTION

Figure 2:
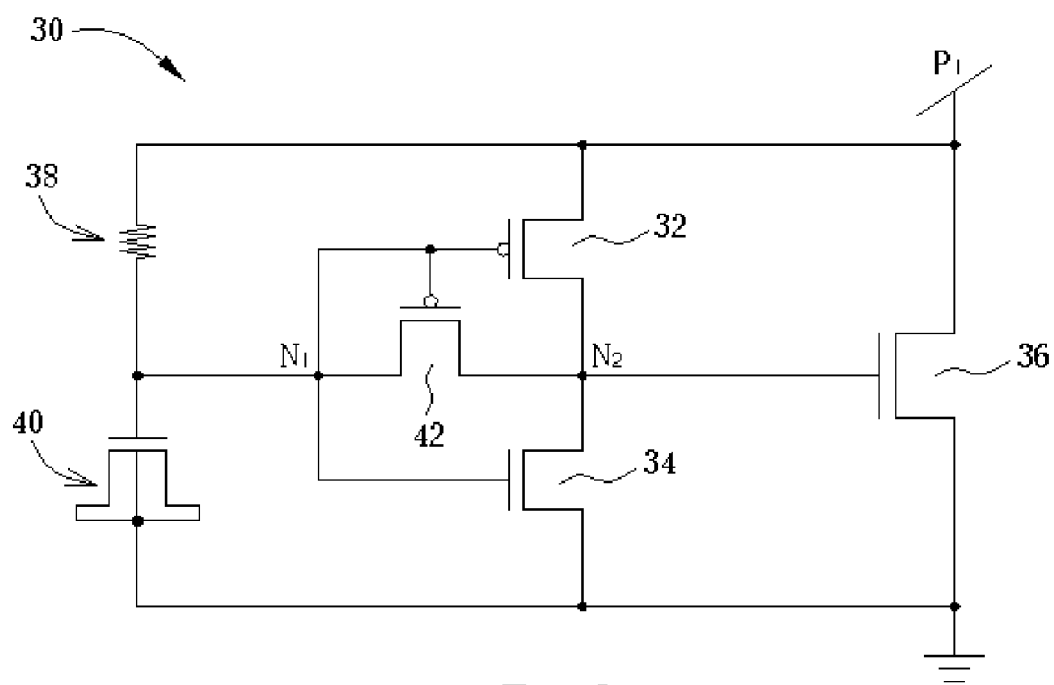
FIG. 2 is a perspective view of a power supply clamp circuit according to the present invention.

Please refer to FIG. 2. FIG. 2 is a perspective view of a power supply clamp circuit 30 electrically connected between a first voltage source P1 and ground. The power supply clamp circuit 30 comprises a first PMOS transistor 32, a first NMOS transistor 34, a second NMOS transistor 36, a resistor 38, a capacitor 40, and a second PMOS transistor 42. The first PMOS transistor 32 has a source electrically connected to the first voltage source P1, a gate electrically connected to a first node N1, and a drain electrically connected to a second node N2. The first NMOS transistor 34 has a drain electrically connected to the second node N2, a gate electrically connected to the first node N1, and a source connected to ground. The second NMOS transistor 36 has a drain electrically connected to the first voltage source P1, a gate electrically connected to the second node N2, and a source connected to ground. One end of the resistor 38 is electrically connected to the first voltage source P1 and another end of the resistor 38 is electrically connected to the first node N1. One end of the capacitor 40 is electrically connected to the first node N1 and another end of the capacitor 40 is connected to ground. The second PMOS transistor 42 has a source electrically connected to the second node N2, and a gate and a drain both electrically connected to the first node N1.

Similarly to the prior art, in FIG. 2, a function of the combined resistor 38 and capacitor 40 can be regarded as a voltage generator. The voltage generator generates a voltage at the first node N1, and the voltage at the first node N1 is a sensitive value to an electrostatic discharge and responds differently under a condition of normal operation and a condition of an electrostatic discharge of an integrated circuit. When the first voltage source P1 turns on during the normal operation, a voltage at the first node N1 increases in velocity very slowly. Therefore, the voltage at the first node N1 and the voltage at the first voltage source P1 increase simultaneously. However, when an electrostatic discharge occurs, the voltage at the first voltage source P1 increases in velocity very quickly. At this time, because of how the voltage generator works, during a transient time of the voltage at the first voltage source P1 starting to increase, the voltage at the first node N1 cannot completely respond with the voltage increasing velocity at the first voltage source P1, resulting in an obvious voltage difference between the first voltage source P1 and the first node N1. Moreover, in FIG. 2, the capacitor 40 is an integrated circuit capacitor connecting a source and a drain of a transistor and well known by those skilled in the art.

Next, working principles of the power supply clamp circuit 30 to the present invention will be described. When the first voltage source P1 turns on during a normal operation, a voltage difference between the first node N1 and the first voltage source P1 will not appear during a voltage increasing process at the first voltage source P1. That is, a voltage difference $V_{sgp32}$ between a source (as the first voltage source P1) and a gate (as the first node N1) of the first PMOS transistor 32 is equal to 0V to make the first PMOS transistor 32 get into the status of turning off during the voltage increasing process at the first voltage source P1. After a voltage at the first node N1 increases to a voltage that can turn on the first NMOS transistor 34, a voltage at the second node N2 declines to ground when the first NMOS transistor 34 turns on. Therefore, the second NMOS transistor 36 always keeps the status of turning off to avoid the leakage current from the first voltage source P1 to ground.

Please note, a voltage at a drain (as the second node N2) of the second PMOS transistor 42 is ground voltage, and a voltage at a gate and a source(as the first node N1) of the second PMOS transistor 42 is equal to the first voltage source P1. Therefore, a voltage difference $V_{sgp42}$ between the source and the gate of the second PMOS transistor 42 is equal to 0V to result in the second PMOS transistor 42 getting into the status of turning off and not having any impact on the power supply clamp circuit 30.

A voltage pulse is generated at the first voltage source P1 in with very quick velocity when an electrostatic discharge occurs. Then, as mentioned above, a voltage difference is generated between the first node N1 and the first voltage source P1. That is, a voltage difference $V_{sgp32}$ between a source (as the first voltage source P1) and a gate (as the first node N1) of the first PMOS transistor 32 is greater than a threshold voltage of the PMOS transistor 32 to result in the first PMOS transistor 32 getting into the status of turning on. When the first PMOS transistor 32 turns on, a voltage at the second node N2 will be pulled up by the first voltage source P1 to make the second NMOS transistor 36 turn on. Through the above-mentioned actions, the power supply clamp circuit 30 provides a current path from the first voltage source P1 to ground by turning on the second NMOS transistor 36. Therefore, a voltage pulse at the first voltage source P1 generated by an electrostatic discharge discharges through the path to ground and does not to damage the interior circuits of the integrated circuits.

Please note, at this time a voltage at the source (as the second node N2) of the second PMOS transistor 42 is equal to the first voltage source P1, but a voltage at the gate (as the first node N1) of the second PMOS transistor 42 is different from the first voltage source P1. Therefore, a voltage difference $V_{sgp42}$ between the source and the gate of the second PMOS transistor 42 is greater than a threshold voltage of the PMOS transistor 42 to result in the second PMOS transistor 42 getting into the status of turning on. Based on interactions of the first PMOS transistor 32 and the second PMOS transistor 42, a voltage at the second node N2 can automatically clamp to a proper voltage and avoid to increase to a higher voltage level.

It is important to notice that, to enhance an electrostatic discharge level of the power supply clamp circuit 30, the second NMOS transistor 36 is usually designed as a bigger size of transistor or has higher P+ implantation dosage to a drain in the ion implantation process to enhance a discharge capability of the current path.

Figure 1:
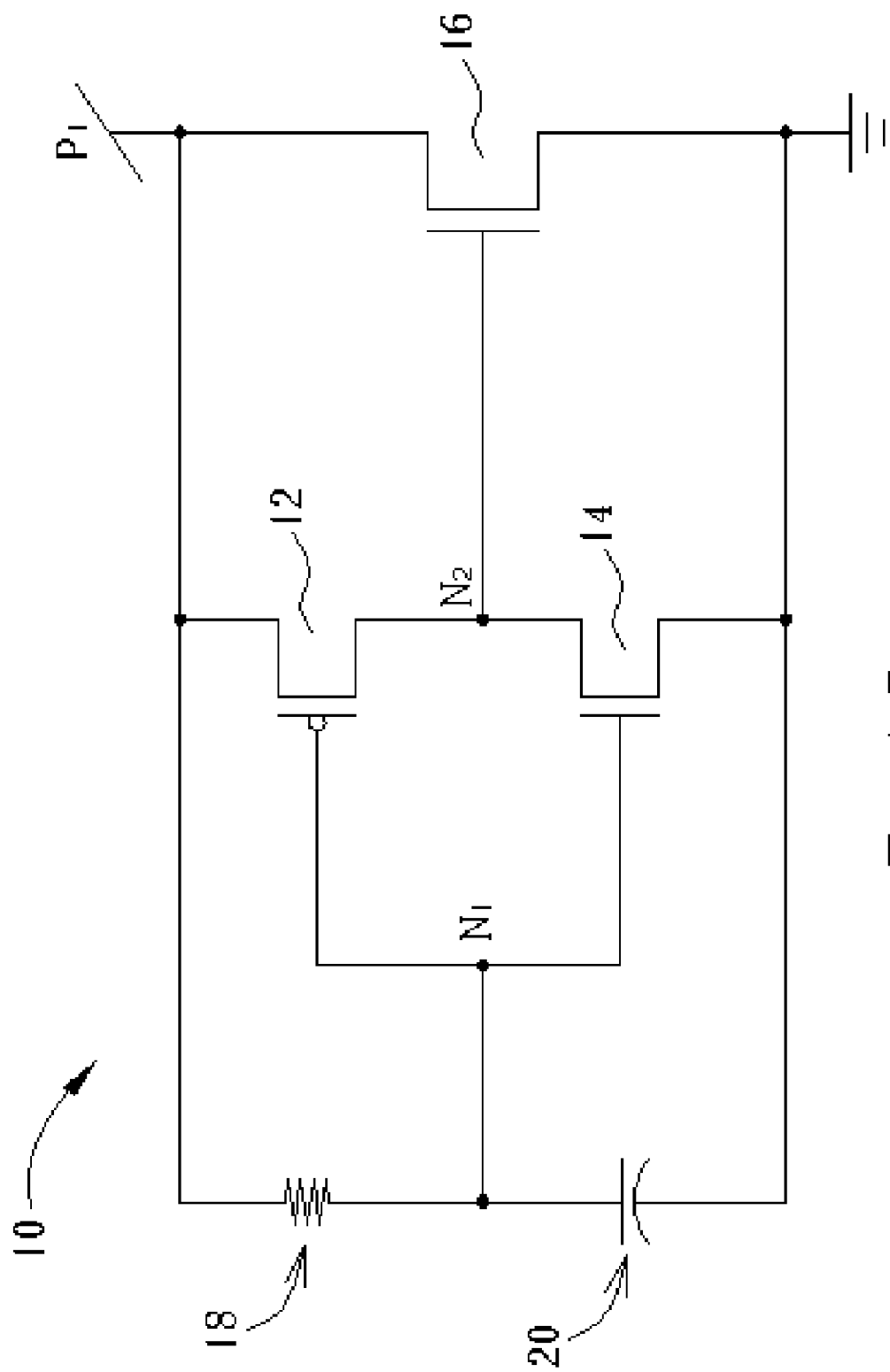
FIG. 1 is a perspective view of a power supply clamp circuit according to the prior art.
Figure 3:
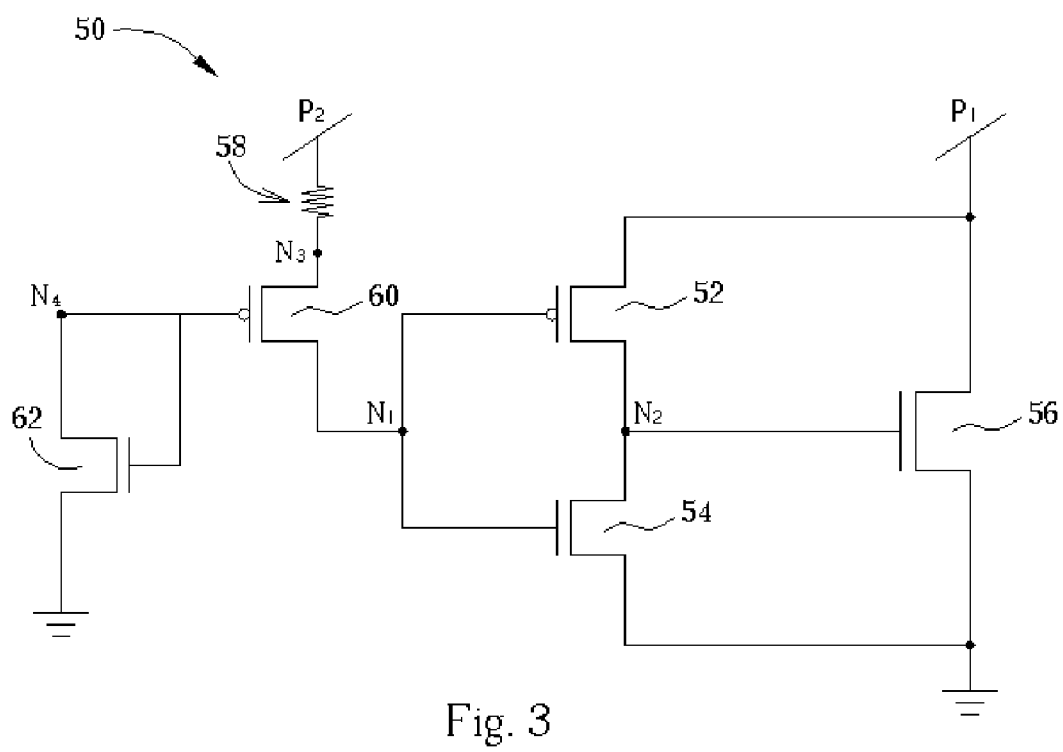
FIG. 3 is a perspective view of another power supply clamp circuit according to the present invention.

Next, please refer FIG. 3. FIG. 3 is a prospective view diagram of another power supply clamp circuit 50 electrically connected between a first voltage source P1 and ground to the present invention. The power supply clamp circuit 50 is similar to the power supply clamp circuit 10 of the prior art, and no further description is needed. However, one difference is having a second voltage source P2 that is independent from a first voltage source P1 but with the same voltage, such as 3.3V. Therefore, a voltage pulse is generated at the first voltage source P1 increasing in velocity very quickly when an electrostatic discharge occurs. The second voltage source P2 will not have the same phenomenon. Thus, the power supply clamp circuit 50 can utilize this characteristic to form a resistor 58, a third PMOS transistor 60, a third NMOS transistor 62 in FIG. 3 as a voltage generator that has the same function as the voltage generator formed by the resistor 18 and the capacitor 20 in FIG. 1. One end of the resistor 58 is electrically connected to the second voltage source P2 and the another end of the resistor 58 is electrically connected to a third node N3. The third PMOS transistor 60 has a source electrically connected to the third node N3, a gate electrically connected to a fourth node N4, and a drain electrically connected to a first node N1. The third NMOS transistor 62 has a drain and a gate both electrically connected to the fourth node N4, and a source connected to ground.

Please note that the third NMOS transistor 62 is a connected diode and in the status of turning on to pull down a voltage at the fourth node N4 to ground. Thus, the third PMOS transistor 60 is in the status of turning on to result in a voltage set by the first node N1 as the same as the second voltage source P2.

Next, working principles of the power supply clamp circuit 50 to the present invention will be described. When the first voltage source P1 and the second voltage source P2 both turn on during normal operation, an increasing velocity of the first voltage source P1 and of the second voltage source P2 is the same. Thus, a voltage difference between the first node N1 and the first voltage source P1 will not appear during a voltage increasing process at the first voltage source P1. That is, a voltage difference $V_{spp1}$ between a source (as the first voltage P1) and a gate (as the first node N1) of the first PMOS transistor 52 is equal to 0V to make the first PMOS transistor 52 get into the status of turning off during the voltage increasing process at the first voltage source P1. When a voltage at the first node N1 increases to the voltage that can turn on the first NMOS transistor 54, a voltage at the second node N2 declines to ground because of the first NMOS transistor 54 turning on. Therefore, the second NMOS transistor 56 always keeps in the status of turning off resulting in the first voltage source P1 being capable of developing a function of power supply voltage that is originally provided to integrated circuits.

When the first voltage source P1 generates a voltage pulse increasing in velocity very quickly when an electrostatic discharge occurs, the second voltage source P2 is independent from the first voltage source P1 and will not generate the same voltage pulse. Therefore, a voltage difference between the first node N1 and the first voltage source P1 is generated, and a voltage difference $V_{spp1}$ between a source (as the first voltage source P1) and a gate of (as the first node) of the first PMOS transistor 52 is greater than 0V, resulting in the first PMOS transistor 52 getting into the status of turning on. When the first PMOS transistor 52 turns on, a voltage at the second node N2 pulled up by the first voltage source P1 to a voltage that can make the second NMOS transistor 56 turn on. Through the above actions, the power supply clamp circuit 50 can provide a current path from the first voltage source P1 to ground by means of the second NMOS transistor 56 getting into the status of turning on. Thus, a voltage pulse at the first voltage source P1 generated by an electrostatic discharge can perform a discharge to ground through the path and not damage the interior circuits of the integrated circuits.

Similarly, to enhance an electrostatic discharge level of the power supply clamp circuit 50, the second NMOS transistor 56 is usually designed as a bigger size of transistor or has higher P+ implantation dosage to a drain in the ion implantation process to enhance a discharge capability through the current path.

Figure 4:
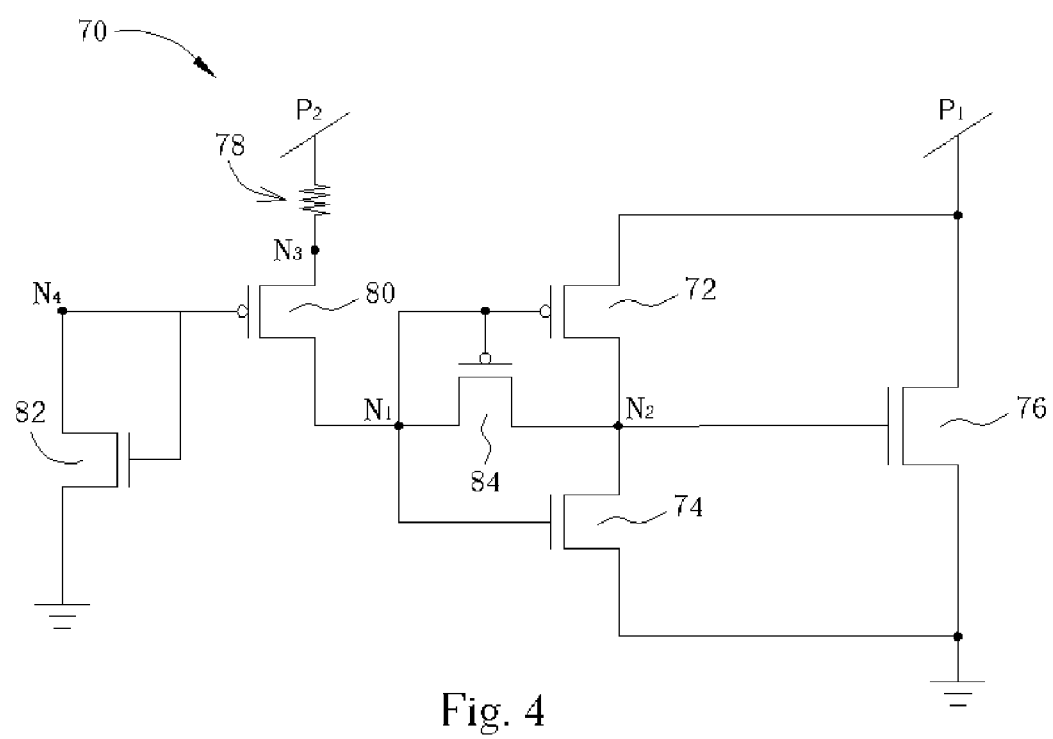
FIG. 4 is a perspective view of another power supply clamp circuit according to the present invention.

Next, please refer to FIG. 4. FIG. 4 is a prospective view of another power supply clamp 70 according to the present invention electrically connected between a first voltage source P1 and ground. The power supply clamp circuit 70 is similar to the power supply clamp circuit 50 mentioned above and no further description is needed. However, the power supply clamp circuit 70 is similar to the power supply clamp circuit 30 of FIG. 2 in that the power supply clamp circuit 70 comprises a second PMOS transistor 84. The function of the second PMOS transistor 84 is the same as the function of the second PMOS transistor 42. When an electrostatic discharge occurs at the first voltage source P1, the second PMOS transistor 84 gets into the status of turning on. Interaction of a first PMOS transistor 72 and the second PMOS transistor 84 makes a voltage at a second node N2 able to adjust into a desired voltage range automatically. Working principles of the power supply clamp circuit 70 in FIG. 4 are similar to the working principles of the power supply clamp circuit 30 of FIG. 2 and no further description is needed.

Similarly, to enhance an electrostatic discharge level of the power supply clamp circuit 70, a second NMOS transistor 76 is usually designed as a bigger size of transistor or has higher P+ implantation dosage to a drain in the ion implantation process to enhance a discharge capability of the current path.

In contrast to the power supply clamp of the prior art, the power supply clamp of the present invention utilizes a design of a second PMOS transistor installed between the first node and the second node to make a voltage at the second node restricted into a desired voltage range. Therefore, circuit designers skilled in the prior art can simplify adjusting processes of circuit parameters to maintain a higher electrostatic discharge level of the power supply clamp circuit and reduce design costs.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A power supply clamp circuit for preventing damage to integrated circuits when electrostatic discharge occurs at a first voltage source of the integrated circuits, the integrated circuits further comprising a second voltage source that is independent from the first voltage source and having the same voltage as the first voltage source, the power supply clamp circuit comprising:
    a first voltage generator electrically connected to a first node for generating a voltage;
    a first PMOS transistor having a source electrically connected to the first voltage source, a gate electrically connected to the first node, and a drain electrically connected to a second node;
    a first NMOS transistor having a drain electrically connected to the second node, a gate electrically connected to the first node, and a source connected to ground;
    a second NMOS transistor having a drain electrically connected to the first voltage source, a gate electrically connected to the second node, and a source connected to ground; and
    a second PMOS transistor having a source electrically connected to the second node, a gate and a drain both electrically connected to the first node.

2. The power supply clamp circuit of claim 1 wherein a drain of the second NMOS transistor of the power supply clamp circuit has P+ implantation dosage in an ion implantation process.

3. The power supply clamp circuit of claim 1 wherein the first voltage generator of the power supply clamp circuit comprises:
    a resistor having one end of the resistor electrically connected to the first voltage source and another end of the resistor electrically connected to the first node; and
    a capacitor having one end of the capacitor electrically connected to the first node and another end of the capacitor connected to ground.

4. The power supply clamp circuit of claim 3 wherein the resistor of the first voltage generator comprises metal wiring.

5. The power supply clamp circuit of claim 3 wherein the capacitor of the first voltage generator comprises an NMOS transistor having a drain and a gate electrically connected to a substrate.

6. A power supply clamp circuit for preventing damage to integrated circuits when electrostatic discharge occurs at a first voltage source of the integrated circuits, the power supply clamp circuit comprising:
    a first PMOS transistor having a source electrically connected to the first voltage source, a gate electrically connected to a first node, and a drain electrically connected to a second node;
    a first NMOS transistor having a drain electrically connected to the second node, a gate electrically connected to the first node, and a source connected to ground;
    a second NMOS transistor having a drain electrically connected to the first voltage source, a gate electrically connected to the second node, and a source connected to ground;
    a second voltage source being independent from a first voltage source and having the same voltage as the first voltage source;
    a resistor with one end of the resistor electrically connected to the second voltage source and another end of the resistor electrically connected to a third node;
    a second PMOS transistor having a source electrically connected to the third node, a gate electrically connected to a fourth node, and a drain electrically connected to the first node; and
    a third NMOS transistor having a drain and a gate commonly electrically connected to the fourth node, and a source connected to ground.

7. The power supply clamp circuit of claim 6 wherein the drain of the second NMOS transistor of the power supply clamp circuit has P+ implantation dosage in an ion implantation process.

8. The power supply clamp circuit of claim 6 wherein the resistor of the power supply clamp circuit comprises metal wiring.

9. The power supply clamp circuit of claim 1 wherein, the second voltage source comprises:
    a resistor with one end of the resistor electrically connected to the second voltage source and another end of the resistor electrically connected to a third node;
    a third PMOS transistor having a source electrically connected to the third node, a gate electrically connected to a fourth node, and a drain electrically connected to the first node; and
    a third NMOS transistor having a drain and a gate commonly electrically connected to the fourth node, and a source connected to ground.

10. The power supply clamp circuit of claim 9 wherein a drain of the second NMOS transistor of the power supply clamp circuit has P+ implantation dosage in an ion implantation process.

11. The power supply clamp circuit of claim 9 wherein the resistor of the second voltage source comprises metal wiring.

* * * * *